United States Patent [19]
Amir

[11] Patent Number: 6,103,978
[45] Date of Patent: Aug. 15, 2000

[54] PRINTED WIRING BOARD HAVING INNER TEST-LAYER FOR IMPROVED TEST PROBING

[75] Inventor: Israel Amir, Princeton, N.J.

[73] Assignee: Lucent Technologies Inc., Murray Hill, N.J.

[21] Appl. No.: 08/993,373

[22] Filed: Dec. 18, 1997

[51] Int. Cl.⁷ .................................................. H05K 1/16
[52] U.S. Cl. ..................... 174/255; 324/158.1; 324/537; 324/765; 361/795; 361/799; 174/262
[58] Field of Search ..................................... 174/255, 260, 174/261, 262–266; 324/158.1, 537, 765, 755; 361/730, 752, 753, 766, 790, 794, 795, 799; 257/758, 700, 724; 438/14–18

[56] References Cited

U.S. PATENT DOCUMENTS

| | | | |
|---|---|---|---|
| 3,963,986 | 6/1976 | Morton et al. | 324/756 |
| 5,375,040 | 12/1994 | Cooper et al. | 361/730 |
| 5,723,908 | 3/1998 | Fuchida et al. | 257/758 |

*Primary Examiner*—Hyung-Sub Sough
*Attorney, Agent, or Firm*—Mathews, Collins, Shepherd & Gould, P.A.

[57] ABSTRACT

A multilayered printed wiring board (PWB) with improved probing for in-circuit, functional, and prototype testing. The PWB includes a support layer and at least a top layer disposed over the support layer. The top layer has one or more circuits with traces for measuring signals produced by the circuit. A test-layer for routing the signals to the edge of the board is provided between the top layer and the support layer. The test-layer includes long traces extending from a first location substantially beneath the traces to a second location adjacent to the edge of the board. Contacts for measuring the signals produced by the circuit are provided on the top layer adjacent to the edge of the board. A first set of vias may be used to connect the first ends of the long traces to the traces on the top layer and a second set of vias may be used to connect the second ends of the long traces to the contacts. Buried resistors embedded in the test-layer may be provided for connecting the first set of vias with the long traces to create resistive coupling and low-level feedback for probing of the circuit at the contacts.

7 Claims, 1 Drawing Sheet

PRINTED WIRING BOARD HAVING INNER TEST-LAYER FOR IMPROVED TEST PROBING

FIELD OF THE INVENTION

This invention relates to printed wiring boards and, in particular, to a printed wiring board including a dedicated inner test-layer for routing testing points to the board edges.

BACKGROUND OF THE INVENTION

Testing is an important part of the manufacture and use of printed wiring boards (PWBs). PWBs provide mounting and interconnection for integrated circuit chips in many electronic devices and systems. As the number of chips interconnected increases, it is important to be able to test the operation of chip components and the resulting circuit.

Unfortunately, increasing component density has also made it more difficult to test the components on the device area of a PWB. The device area is the portion of the PWB populated with various active and passive electronic devices. With increasing density, this area is filled, with little space remaining for testing points.

The conventional PWB has a device area including an array of testing points and is tested using a "bed of nails" probe. These probes have relatively "long nails" that must extend across the PWB without interfering with the devices mounted thereon. PWB stretch and shear, contact size limitations, and the length of the nails, all substantially reduce the accuracy of nail/contact registration and produce mediocre contact performance.

Recent technological trends also call for PWBs that operate at higher signal frequencies, typically in the radio frequency (RF) range. These PWBs require in-circuit, functional, and prototype RF testing to determine electrical characteristics across a circuit path of interest. Providing PWB testing points for RF probing is particularly difficult even with relatively short traces leading from the circuits to the contacts or probe pads. Indeed, designers often eliminate these contacts and their associated traces in order to speed up the PWB design process. Furthermore, at radio frequencies, signals travel on the surface of the conductor. Consequently, the mediocre contact performance inherent in bed-of-nails probing is especially detrimental.

RF testing points provided within the device area of a PWB are often blocked or covered by RF shields or housings installed to the PWB, making the testing points inaccessible for RF functional testing. If the shielding or housing is removed to gain access to the testing points, the circuit of interest often becomes inoperable. Inaccessible testing points also extend the duration of the prototyping phase because debugging becomes more difficult. Consequently, the PWB's time-to-market is substantially increased.

Accordingly, there is a need for a PWB with improved probing for in-circuit, functional, and prototype testing.

SUMMARY OF THE INVENTION

A multilayered printed wiring board (PWB) is modified for improved probing for in-circuit, functional, and prototype testing. The PWB includes a support layer and at least a top layer disposed over the support layer. The top layer has one or more circuits with traces for measuring signals produced by the circuit. A test-layer for routing the signals to the edge of the board is provided between the top layer and the support layer. The test-layer includes long traces extending from a first location substantially beneath the traces to a second location adjacent to the edge of the board. Contacts for measuring the signals produced by the circuit are provided on the top layer adjacent to the edge of the board. In a preferred embodiment, a first set of vias connect the first ends of the long traces to the traces on the top layer and a second set of vias connect the second ends of the long traces to the contacts. Resistive elements close to the first set of vias and connecting the first set of vias with the long traces can also be included on the test-layer to provide resistive coupling and low-level feedback for probing of the circuit at the contacts. The resistive elements are preferably buried resistors embedded in the test-layer.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

DETAILED DESCRIPTION OF THE INVENTION

Figure 1:
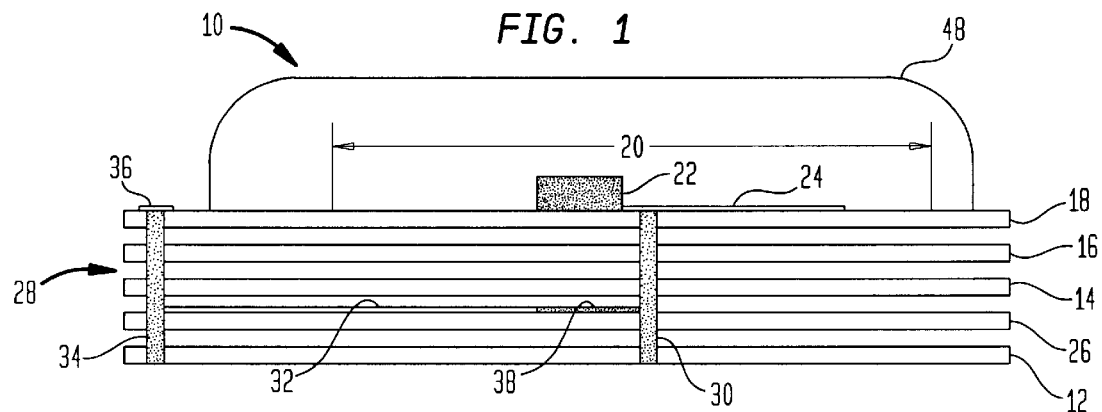
FIG. 1 is a diagrammatic side view of a multilayer PWB made according to the present invention.

FIG. 1 is a diagrammatic side view of a multilayer PWB 10 according to the present invention. The PWB 10 typically comprises a bottom layer 12, a ground layer 14, a stripline layer 16, and a micro-strip top layer 18. The top layer 18 includes a device area 20 between the broken lines. An electronic device 22, such as an integrated RF circuit and its associated set of traces typically referred to as short traces 24 (only one is visible), are disposed on the top layer 18 in the device area 20. The short traces 24 provide conventional test points for the device 22.

In accordance with the invention, an inner test-layer 26 is disposed between the ground layer 14 and the bottom layer 12. The test-layer 26 is exclusively dedicated for routing device area test points to an edge 28 of the PWB 10. For ease of illustration, only one test point (defined by the short trace 24) is shown routed via the test-layer 26 to the edge 28 of the PWB 10 in FIG. 1. This is carried out by an integrally formed jumper comprised of a first via 30 extending through the PWB 10 from the short trace 24, a second trace 32 (long trace) connected to the first via 30 and extending along the test-layer 26 to a location adjacent the edge 28 of the PWB 10, and a second via 34 located near the edge 28 of the PWB 10 that contacts the long trace 32 and extends up to the top layer 18 of the PWB 10. Probing at the edge 28 of the PWB 10 is made possible by providing a large-area contact or edge connector 36 on top layer 18 which contacts the second via 34.

A buried resistor 38 is embedded in the test-layer 26 between the long trace 32 and the first via 30 for providing resistive coupling and low-level feedback for probing at the contact 36. Buried resistors are currently used in a variety of existing products and are superior to more conventional chip resistors at microwave frequencies. Buried resistors also have superior stability and substantially less "parasitic" problems than chip resistors. The buried resistors are fabricated using conventional foil technology. There are a variety of foils which can be used for the buried resistors. The foils are classified by their resistance per square, therefore, the type of foil used depends on the desired resistance per square for a given application. The resistance of the buried resistors 38 is made large relative to the RF impedance of the circuit of the device 22 to reduce the loading on the RF circuit.

In some applications, resistive coupling may not be necessary and therefore, the buried resistors 38 needn't be provided between the long trace and the first via 30. In other applications, however, resistive coupling may be inadequate. In these applications, capacitive or micro-strip coupling can be used to provide a low-level feedback for probing, even though they are not useful for integrated circuit testing. However, capacitive or microstrip coupling do provide a go/no-go test to ensure the presence of RF signals for PWB diagnostic purposes. Additionally, adequate geometric control of these coupling elements allows calibrated measurements under operating conditions. Capacitive and micro-strip coupling elements (not shown) can be provided on either the top layer 18 or the test layer 26. If capacitive or micro-strip coupling elements are used, the vias described earlier would be omitted.

The large-area contact 36 provides a physical node point for RF testing and probing at the edge 28 of the PWB 10 which substantially increases PWB utilization. The test-layer 26 make this possible with an effective distance between the contact 36 and the buried resistor 38 of not larger than 10–30 mils, which is the distance between the top layer 18 and the test-layer 26.

Providing contacts along the edges of the PWB advantageously increases test coverage without decreasing PWB utilization because the contacts are not provided in the device area. Even when the edges of the PWB are utilized for device assembly, the contact density at the edge can be made greater, limited only by fundamental line and spacing design constraints, than contacts located within the device area. Edge contacts also eliminate the use of troublesome probes with long nails, as there are no components at the edge of a PWB to interfere with. Stretch and shear problems are also avoided because the entire edge of the PWB need not be covered with a single connector. A housing 48 may cover the board except for the edge and the contacts.

Improvements in the quality of probing are realized since edge contacts can be made substantially larger without having to deal with components near the edge of the PWB. Large contacts are easily cleaned and allow greater applied probing forces, advantageously resulting in higher quality contact performance. Providing contacts at the edge of the PWB also allows the RF shields to remain installed to the PWB during RF functional testing and prototyping. This improves functional testing and makes PWBs easier to debug during prototyping, decreasing the time-to-market of the PWB.

Figure 2:
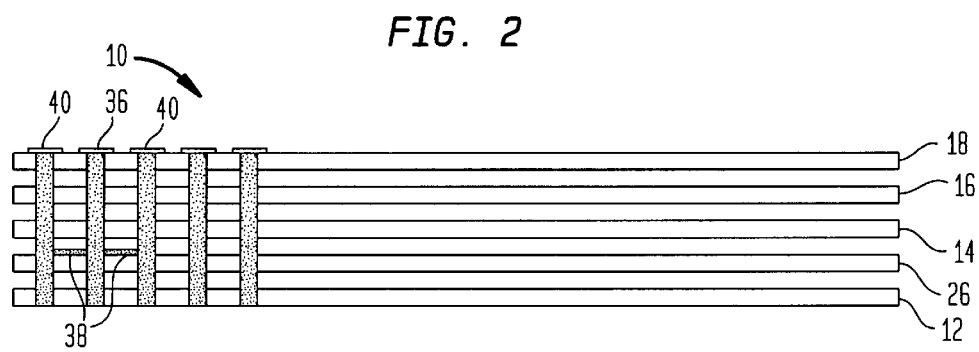
FIG. 2 is a diagrammatic edge view of the PWB of FIG. 1.

FIG. 2 is a diagrammatic edge view of the PWB 10 of FIG. 1 that shows ground contacts 40 on both sides of the contact 36 at the edge of the PWB 10. The ground contacts 40 are also routed via the test layer 26 from the short traces 24 (not visible) using the long traces 32 and buried resistors 38. In the example shown, the buried resistors 38 are 100 ohms each and parallel coupled to provide a 50 ohm termination at the edge 28 of the PWB 10. Other contact arrangements are possible depending on the design of the PWB.

Figure 3:
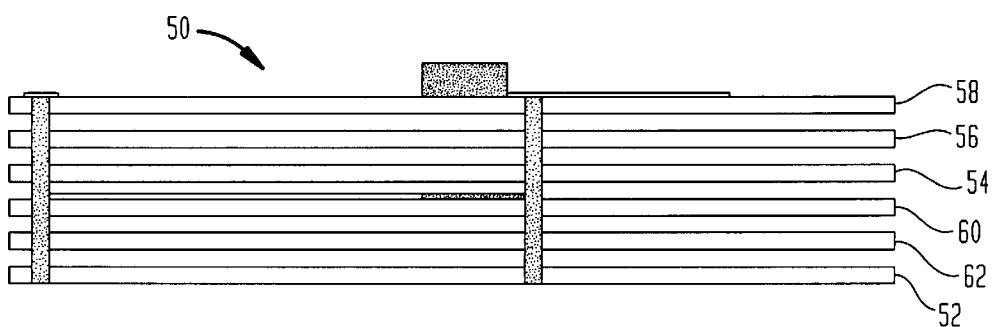
FIG. 3 is a diagrammatic side view of another multilayer PWB made according to the present invention.

FIG. 3 is a diagrammatic edge view of another PWB 50 which requires a minimum of an odd number of layers. In this PWB 50, an extra ground layer 62 is disposed between the test-layer 60 and the bottom layer 52 so that the test-layer 60 is sandwiched between two ground layers 62, 54 to provide an additional level of electrical isolation between the test-layer 60 and the other layers 52, 56, and 58 of the PWB 50.

It is understood that the above-described embodiments illustrate only a few of the many possible specific embodiments which can represent applications of the principles of the invention. For example, although the inner test-layer approach has been described as it applies to RF probing, it is equally suited for high speed digital and DC probing. Hence, numerous modifications and changes can be made by those skilled in the art without departing from the spirit and scope of the invention.

What is claimed is:

1. A multilayered printed wiring board comprising:

a support layer;

a top layer disposed over said support layer;

at least one circuit disposed on said top layer, said at least one circuit including a first set of traces for measuring signals produced by said at least one circuit;

a test layer disposed between said top layer and said support layer, said test layer including a second set of traces including resistive elements and extending from a first location substantially beneath said first set of traces to a second location;

contacts for measuring said signals produced by said at least one circuit, said contacts disposed on said top layer adjacent to an edge of said board;

a first set of vias connecting said second set of traces to said first set of traces; and a second set of vias connecting said second set of traces to said contacts through said resistive elements to provide resistive coupling and low-level feedback for probing of said at least one circuit at said contacts.

2. The board according to claim 1, wherein said resistive elements comprise buried resistors embedded in said test-layer.

3. The board according to claim 1, wherein said test-layer is sandwiched between a pair of ground layers to provide electrical isolation.

4. The board according to claim 1, wherein said contacts are for radio frequency probing of said at least one circuit.

5. The board according to claim 1, wherein said contacts are for high speed digital probing of said at least one circuit.

6. The board according to claim 1, wherein said contacts are for high DC probing of said at least one circuit.

7. The board according to claim 1, further comprising a housing attached thereto, said housing covering said board except for said edge and said contacts.

* * * * *